(12) United States Patent
Kim et al.

(10) Patent No.: US 9,059,220 B2
(45) Date of Patent: Jun. 16, 2015

(54) POLYSILICON MANUFACTURING DEVICE

(71) Applicant: Iljin Plant Service Co., Ltd., Ulju-gun, Ulsan (KR)

(72) Inventors: Ik-jin Kim, Ulsan (KR); Sung-hwan Choi, Ulsan (KR)

(73) Assignee: Iljin Plant Service Co., Ltd. (KR)

( * ) Notice: Subject to any disclaimer, the term of this patent is extended or adjusted under 35 U.S.C. 154(b) by 0 days.

(21) Appl. No.: 14/549,115

(22) Filed: Nov. 20, 2014

(65) Prior Publication Data

US 2015/0098871 A1    Apr. 9, 2015

Related U.S. Application Data

(63) Continuation of application No. PCT/KR2014/000364, filed on Jan. 13, 2014.

(30) Foreign Application Priority Data

Jan. 14, 2013    (KR) .................... 10-2013-0004000

(51) Int. Cl.
*C30B 35/00*    (2006.01)
*C23C 16/00*    (2006.01)
(Continued)

(52) U.S. Cl.
CPC ........ *H01L 21/67017* (2013.01); *C23C 16/455* (2013.01); *C23C 16/50* (2013.01); *C01B 33/035* (2013.01); *C23C 16/46* (2013.01); *C23C 16/24* (2013.01); *C01B 33/1071* (2013.01); *Y10T 117/10* (2015.01); *Y10T 428/2913* (2015.01)

(58) Field of Classification Search
CPC .. C01B 33/035; C01B 33/1071; C23C 16/24; Y10T 117/10; Y10T 428/2913

USPC ..................... 117/200, 205, 84, 88
See application file for complete search history.

(56) References Cited

U.S. PATENT DOCUMENTS

| | | | |
|---|---|---|---|
| 2009/0081380 A1* | 3/2009 | Endoh et al. ................. | 427/545 |
| 2009/0136408 A1* | 5/2009 | Endoh et al. ................. | 423/349 |
| 2010/0041215 A1* | 2/2010 | Kim et al. ..................... | 438/488 |
| 2010/0122657 A1* | 5/2010 | Hsieh et al. ............... | 118/723 E |
| 2010/0272922 A1* | 10/2010 | Revankar et al. ............. | 427/588 |

FOREIGN PATENT DOCUMENTS

| | | |
|---|---|---|
| JP | 2008-156212 A | 7/2008 |
| JP | 2009-256188 A | 11/2009 |

(Continued)

OTHER PUBLICATIONS

Search Report for International Patent Application No. PCT/KR2014/000364, mailed Mar. 31, 2014 and Translation (5 pages).

*Primary Examiner* — Matthew Song
(74) *Attorney, Agent, or Firm* — Harness, Dickey & Pierce, P.L.C.

(57) ABSTRACT

The present disclosure in an exemplary embodiment relates to an apparatus for manufacturing polysilicon. The apparatus for manufacturing polysilicon comprises a base plate; a container body coupled to the base plate; at least one rod; a reaction gas source and a power supply. The at least one rod is configured to have legs respectively connected with three electrodes installed on the base plate and to be disposed in the container body. The reaction gas source is configured to communicate with the container body for supplying a reaction gas into the container body. The power supply is configured to connect with the electrodes for supplying an electric current to energize the rod to generate heat.

22 Claims, 8 Drawing Sheets

(51) Int. Cl.
  *H01L 21/67* (2006.01)
  *C23C 16/455* (2006.01)
  *C23C 16/50* (2006.01)
  *C01B 33/035* (2006.01)
  *C23C 16/46* (2006.01)
  *C23C 16/24* (2006.01)
  *C01B 33/107* (2006.01)

(56) References Cited

FOREIGN PATENT DOCUMENTS

| | | |
|---|---|---|
| KR | 10-0768147 B1 | 10/2007 |
| KR | 10-2011-0061984 A | 6/2011 |
| KR | 10-1116594 B1 | 3/2012 |
| KR | 10-1146864 B1 | 5/2012 |
| KR | 10-1302971 B1 | 9/2013 |

\* cited by examiner

POLYSILICON MANUFACTURING DEVICE

CROSS-REFERENCE TO RELATED APPLICATION

This application is a continuation of International Patent Application No. PCT/KR2014/000364, filed Jan. 13, 2014, which claims priority to Korean Patent Application No. 10-2013-0004000, filed on Jan. 14, 2013, the entire disclosures of which are incorporated herein by reference. In addition, this non-provisional application claims priority in countries, other than the U.S., with the same reason based on the Korean patent application, the entire contents of which is hereby incorporated by reference.

BACKGROUND

The statements in this section merely provide background information related to the present disclosure and may not constitute prior art.

TECHNICAL FIELD

The present disclosure in one or more embodiments relates to an apparatus for producing polysilicon. More particularly, the present disclosure relates to an apparatus for producing polycrystalline silicon, which can significantly improve the yield and productivity and reduce electric power consumption.

DISCUSSION

With polycrystalline state of crystal structure and very high purity, polysilicon is now widely used commercially for semiconductor elements, solar cells and the like.

Such polysilicon is manufactured in the form of a rod or particulates and the manufacturing method is as follows:

Initially, silica sand (mainly $SiO_2$) or quartz and graphite (major component: C) undergo a reaction in an arc furnace for producing metallurgical grade Si (hereinafter called MG-Si) of about 99 percent purity.

With the MG-Si used as a starting material, the silane source is synthesized, separated and sufficiently purified via chemical reactions, e.g., a gasification process to produce a raw gaseous silane material with high purity. The produced high purity silane material is the trichlorosilane (TCS, $SiHCl3$) gas which may be reprocessed into the monosilane ($SiH_4$) gas. TCS is obtained by reacting MG-Si with HCl, and the monosilane gas by reacting MG-Si with $SiCl_4$ and $H_2$ or reacting MG-Si with $SiF_4$ and $NaAlH_4$.

Thereafter, solid-state polysilicon is manufactured in a chemical vapor deposition process by precipitating Si from the high purity silane gas in a mixing atmosphere with hydrogen.

The silane gas produces Si particles through hydrogen reduction reaction and thermal decomposition in a high temperature environment, and such produced Si particles are precipitated on a rod or particles serving as a seed for crystallization to provide the polycrystalline (poly) silicon.

For manufacturing the solid-state polysilicon by using the silane gas, it is known to use the fluidized bed precipitation and Siemens precipitation which adopts TCS as a raw material and is mostly preferred for commercial purpose.

The method for precipitating Si by replacing TCS with the preparation of mono-silane as a source material takes advantage of mono-silane featuring a low temperature (approximately 550~850° C.) reaction process which allows less heating requirement by the reactor but a high production yield up to 90%. However, such precipitation method is disadvantageous because the production of TCS requires a subsequent process for substituting Cl bound by Si with H and the high risk of explosion of the materials makes their storage and handling a very sensitive task. Moreover, the Si precipitation process involves a thermal decomposition of mono-silane which generates a large quantity of Si to process. In light of this, polysilicon manufacturers are mainly utilizing Siemens precipitation despite its high reaction temperature and the low yield (about 25% or less).

In the following, the Siemens precipitation will be briefly described referring to FIG. 1. FIG. 1 is a schematic diagram of an apparatus for manufacturing polysilicon by Siemens precipitation which produces a polysilicon rod from silane gas by using a bell-jar reactor.

The Siemens precipitation is carried out a bell-shaped stainless steel reactor (A) which maintains clean air and encloses a thin ∩-shaped Si core rod (B) having opposite ends respectively connected to a pair of electrodes (C). Subsequently, pre-heated to about 300° C. by using a pre-heater, Si core rod (B) has a reduced resistivity so that it can undergo an electrical resistance heating. A supply of electric power of a predetermined potential difference across electrodes (C) will heat Si core rod (B) to a temperature as high as about 1,000~1,150° C., and supplying a reaction gas formed of a silane gas (e.g. TCS) and hydrogen gas ($H_2$) into bell-shaped reactor (A) precipitates Si on the surface of Si core rod (B) to gradually increase the thickness of Si core rod (B). Maintaining such electric resistance heating and precipitation of Si for several to tens of days or more produces a polysilicon rod on the order of about 10 to 15 cm in diameter. When it is difficult to see a further diameter increase of Si core rod (B) in bell-shaped reactor (A), Si precipitating operation is terminated and the polysilicon rod product is taken out. Unreacted gases (HCl, STC, etc.) and generated gases (TCS, $H_2$) from the reaction will be discharged to the outside.

However, such a conventional method has its downside due to the inherent restrictions of using the electrical resistance heating for the thermal decomposition of the silane gas and the Si precipitation, as follows:

First of all, for the purpose of the thermal decomposition of the silane gas to secure the smooth Si precipitation with the electrical resistance heating, the internal temperature of the reactor needs to be maintained at 1,000° C. or higher, which exacts an enormous consumption of the heating electricity, resulting in a quite heavy cost burden. Moreover, the requirement of setting up a high-level power supply facility involves very high initial capital investment costs.

Further, obtaining a desired size of polysilicon product may take longer than tens of days by using the electrical resistance heating for the thermal decomposition of the silane gas and the Si precipitation, which leads to a significant decline in productivity.

SUMMARY OF THE INVENTION

Therefore, the present disclosure provides a poly-silicon manufacturing apparatus which can significantly increase yield and productivity while reducing the electricity consumption as compared with the prior art. In accordance with some embodiments of the present disclosure, an apparatus for manufacturing polysilicon comprises a base plate; a container body coupled to the base plate; at least one rod; a reaction gas source and a power supply. The at least one rod is configured to have legs respectively connected with three electrodes installed on the base plate and to be disposed in the container body. The reaction gas source is configured to communicate with the container body for supplying a reaction gas into the container body. And the power supply is configured to connect with the electrodes for supplying an electric current to energize the rod to generate heat.

In accordance with another embodiment of the present disclosure, an apparatus for manufacturing polysilicon comprises a base plate; a container body coupled to the base plate; at least one rod; a reaction gas source; and a power supply. The at least one rod is configured to have legs respectively connected with three electrodes and a neutral point installed on the base plate and to be disposed in the container body. The reaction gas source is configured to communicate with the container body for supplying a reaction gas into the container body. And a power supply is configured to connect with the electrodes for supplying an electric current to energize the rod to generate heat. According to the apparatus of the present disclosure in some embodiments as described above, the electrodes use the utility three-phase AC power connected to improve the power efficiency while significantly reducing the electricity consumption and operating costs. In addition, the capability to directly plug into the utility three-phase AC power obviates the need for an AC-DC converter or other similar power converters, thereby reducing the systemic complexity and the number of components and further decreasing the facility budget.

Furthermore, using a large-scale electric power with the improved power efficiency provides an enlarged diameter of the precipitate on the rod to ultimately increase the productivity and yield significantly over the conventional technology.

DETAILED DESCRIPTION OF THE PREFERRED EMBODIMENTS

Figure 1:
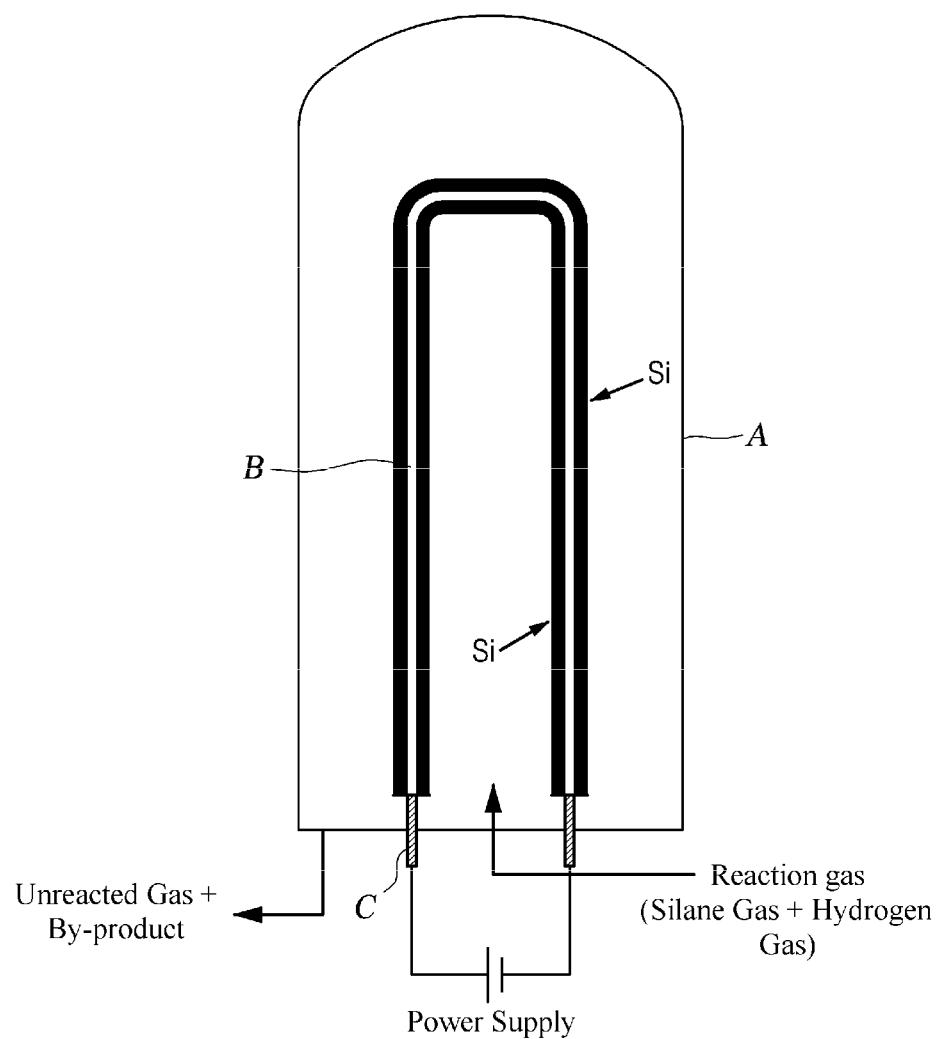
FIG. 1 is a schematic diagram of an apparatus for manufacturing polysilicon by Siemens precipitation.

Hereinafter, at least one embodiment of the present disclosure will be described in detail with reference to the accompanying drawings. In the following description, like reference numerals designate like elements, although the elements are shown in different drawings. Further, in the following description of the at least one embodiment, a detailed description of known functions and configurations incorporated herein will be omitted for the purpose of clarity and for brevity.

Figure 2:
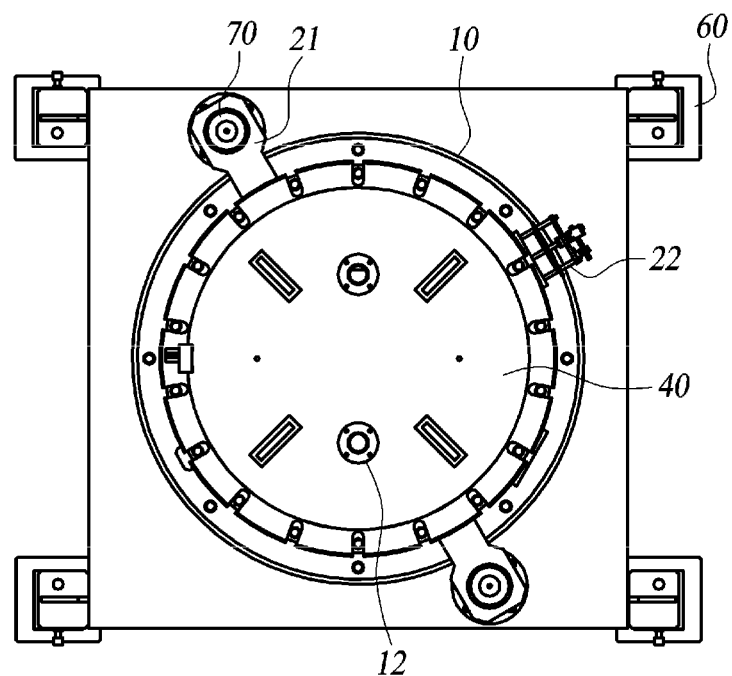
FIG. 2 is a plan view of a polysilicon manufacturing apparatus according to a first embodiment.
Figure 3:
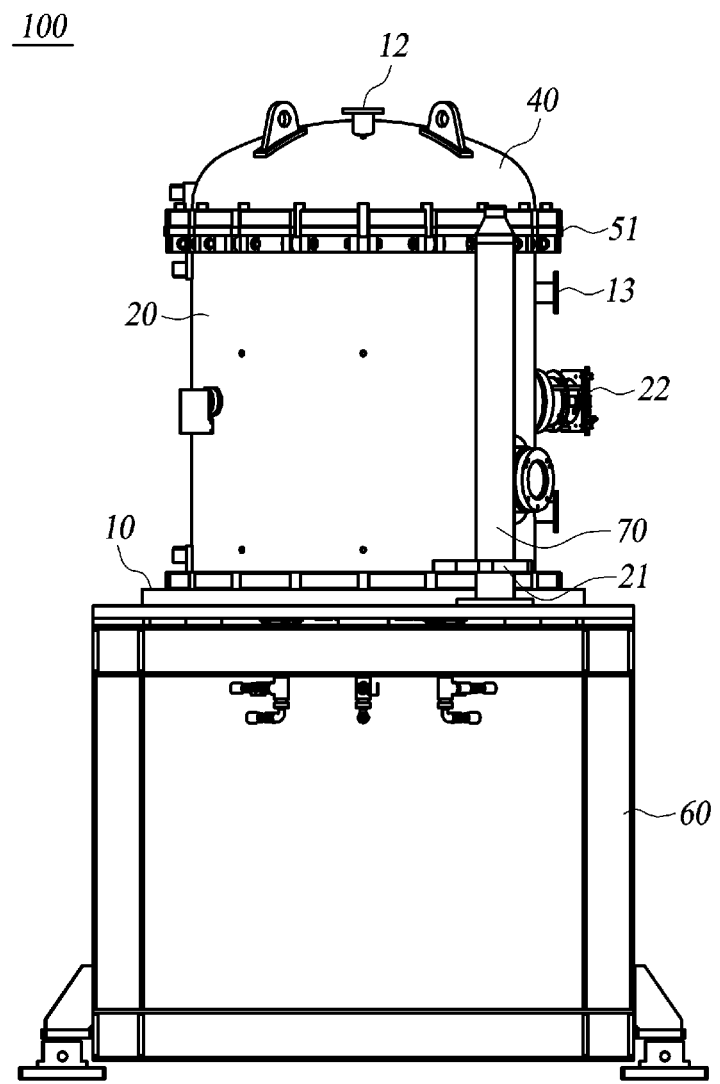
FIG. 3 is a front view of a polysilicon manufacturing apparatus according to a first embodiment.
Figure 4:
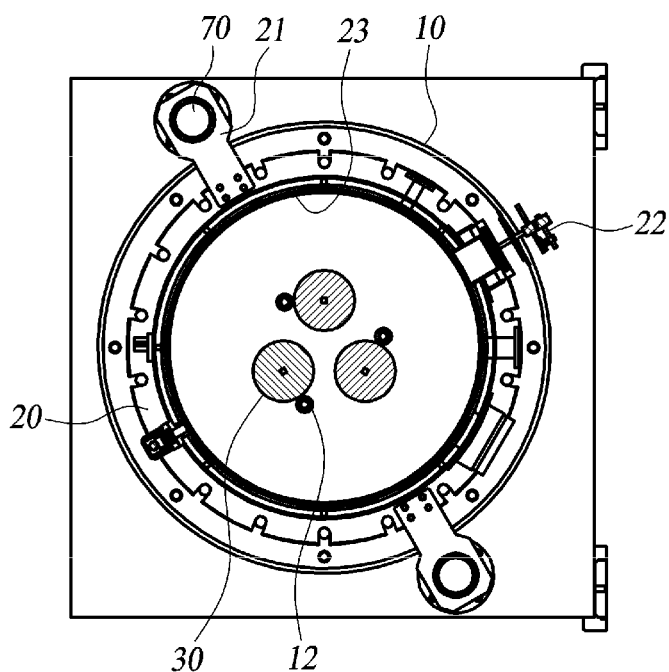
FIG. 4 is a cross-sectional view of the polysilicon manufacturing apparatus according to the first embodiment.
Figure 5:
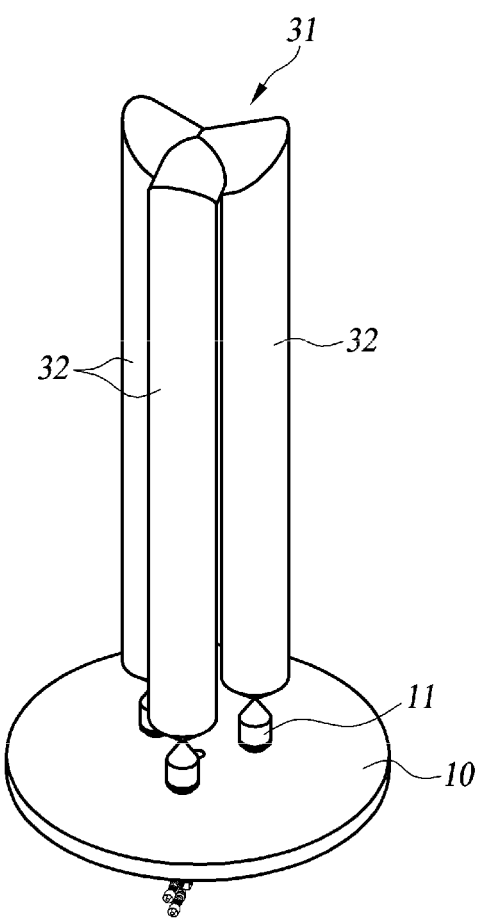
FIG. 5 is a view of the shape of a rod applied to the polysilicon manufacturing apparatus according to the first embodiment.

FIGS. 2 and 3 illustrate a polysilicon manufacturing apparatus according to a first embodiment in plan view and front view, respectively; FIG. 4 a cross-sectional view of the polysilicon manufacturing apparatus; and FIG. 5 shows the shape of a rod applied to the polysilicon manufacturing apparatus.

As illustrated in these drawings, a polysilicon manufacturing apparatus 100 according to the first embodiment includes a base plate 10, a container body 20 fixed onto base plate 10, at least one rod 30 which is disposed internally of container body 20 and has legs 32 connected respectively with the electrodes 11 mounted on base plate 10, a reaction gas supply (not shown) communicating and providing with the interior of container body 20 a supply of a reaction gas, and a power supply installation (not shown) connected to electrodes 11 for supplying the electric current which is used in heating rod 30.

Base plate 10 has electrodes 11 and an inlet pipe 12 or an outlet pipe 13 (see FIG. 7) provided on the base plate 10, and rod 30 of, for example, high-purity Si mounted in electric connection with electrodes 11 may become an exothermic body in response to an upper application of electric power. Base plate 10 may be installed elevated from the floor by using a separate frame 60. In addition, base plate 10 may have at least one guide 70 for assisting the lift of container body 20 off base plate 10 after completion of the reaction by restricting the movement of container body 20 to glide in the vertical upward direction. At a side of container body 20, at least one ring plate 21 is provided to move along guides 70.

Electrodes 11 used may be those as disclosed by Korean Patent No. 101116594 entitled "Electrode for high power system" having been assigned to and executed by the present applicant/assignee. To such electrodes 11, the utility three-phase AC power can be directly fed to improve the power efficiency while significantly reducing the electrical consumption and the resulting operating costs. In particular, direct plugging of electrodes 11 into the utility three-phase AC power enables current to flow immediately and obviates the need for conventional processes for preheating and preheaters. FIG. 5 schematically illustrates three of those electrodes 11 being utilized.

Inlet pipe 12 for supplying the reaction gas is not only installed at base plate 10 but also, where desired, in an upper portion of container body 20 or in a container lid 40 to be described.

Container body 20 is formed in cylindrical or bell shape and has its bottom sealingly assembled to the top surface of base plate 10 to form a sealed interior space that serves as a reaction zone. If necessary, outlet pipe 13 (see FIG. 3) may also be provided on the side wall of container body 20. Container body 20 also has a circulating fluid inlet and a circulating fluid outlet that are not illustrated. A circulating fluid entering the fluid inlet is adapted to flow through a space formed between an outer and an inner walls or tubes of container body 20 before exiting the fluid outlet to thereby properly maintain the internal temperature of container body 20. The circulating fluid is preferably water or oil, but not necessarily limited thereto. For example, in case of using oil, the circulating fluid is in low temperature when first entering container body 20 to serve as a coolant for protecting container body 20 from being overheated until rising to a high temperature from heat transferred through container body 20 to serve somewhat as a thermal reserve fluid for internally preheating container body 20 while keeping the same from losing heat. In addition, after draining from container body 20, the hot oil (e.g., 300° C. or higher) served as the thermal reserve fluid may be heat-exchanged with the reactive gas such as TCS, $H_2$ etc. for taking advantage of the waste heat.

Rod 30 is disposed internally of container body 20. Heating rod 30 to a high temperature by applying electric power through electrodes 11 thermally decomposes the reaction gas supplied into container body 20 to deposit Si on rod 30. Rod 30 in polysilicon manufacturing apparatus 100 according to the first embodiment is installed to connect with electrodes 11 and it preferably has a top portion 31 diverging into a generally Y-shape from which three legs 32 extend terminally downward to complete the integrity of rod 30.

Container body 20 may be provided at its side wall with a monitor window or camera 22 for visual observation of the inside of container body 20. In addition, temperature sensors may be installed through container body 20.

In polysilicon manufacturing apparatus 100 according to the first embodiment, container body 20 may be configured to be separable from lid 40 of a generally hemispherical shape. Optionally, a separate jacket 50 (see FIG. 7) may be mounted internally of container body 20 by providing container body 20 and lid 40 with an interposed counter flange 51 which also serves to partition polycrystalline silicon manufacturing apparatus 100 into a supply zone and a reaction zone of the reaction gas.

Jacket 50 herein utilizes the technology disclosed in Korean Patent Application No. 10-2012-0100211, entitled "Jacket and reactor using same," filed by the present applicant/assignee. Using such lateral gas supply jacket 50 in a double pipe configuration allows the supplied reaction gas to be densely distributed in the polysilicon manufacturing process for improving the yield by increasing the opportunity or time for the reaction gas to contact rod 30. In addition, the high-temperature heat generated from rod 30 can be blocked by jacket 50 to reduce the direct thermal transfer to container body 20. This saves thermal energy from being wasted and in turn the electric power consumption from another application of corresponding electric power, otherwise required to supplement the lost thermal energy on one hand, and enables the reaction gas to contact jacket 50 for receiving a heat transfer toward a proper reaction temperature to substantially improve the efficiency of thermal energy on the other hand. The disclosure of above-identified application is hereby incorporated by reference in its entirety for all purposes.

Nevertheless, the heat energy radiated by the red hot heated rod 30 may be transmitted despite the thermal blockage by jacket 50 to the inside surface of container body 20 with possible loss of energy. To solve this problem, polysilicon manufacturing apparatus 100 according to the first embodiment provides container body 20 with an interior coat 23 for reradiating a part of radiated heat from rod 30 and thereby reducing the energy loss.

Coat 23 preferably comprises at least one of silicon, graphite, silicon carbide (SiC) and glass. The material used to make coat 23 is not limited thereto. For example, coat 23 may be a combination of two or more, or one that is selected from the group comprising: a material coated by silicon carbide, silicon nitride (silicon nitride), silicon, silicon oxide, aluminum oxide, boron nitride, molybdenum or molybdenum based alloy, tungsten or tungsten based alloy, tantalum or tantalum based alloy, a silica based porous material, an aluminosilicate based porous material, a gold-coated porous material, a gold coated material, a platinum-coated porous material, a platinum-coated material, a silica-coated porous material, a silica-coated material, a silver-coated porous material, a silver-coated material and perlite.

For example, coat 23 of glass is completed by first applying a commercially available coating agent by a predetermined thickness on the interior surface of container body 20 and then drying and curing the coating. The presence of coat 23 not only increases the life of container body 20 by fulfilling the requirements of heat resistance and corrosion resistance by container body 20 but also enhances product purity and anticorrosion effect.

Figure 6:
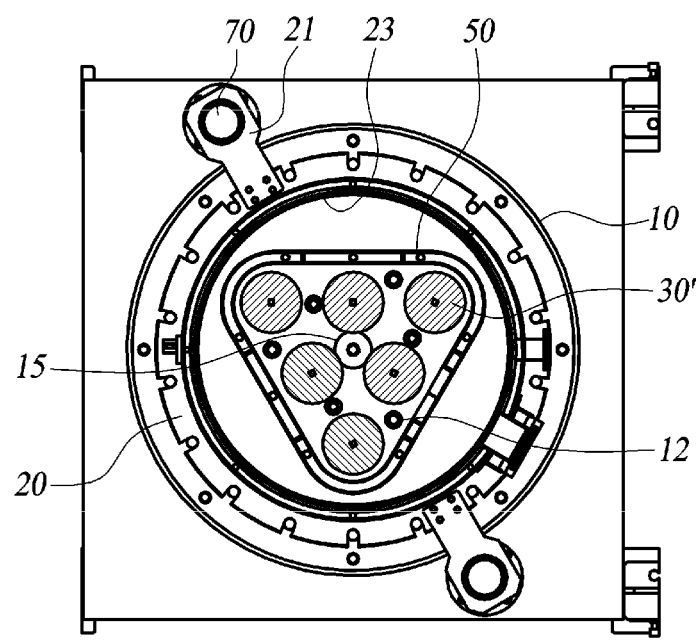
FIG. 6 is a cross-sectional view of a polysilicon manufacturing apparatus according to a second embodiment.
Figure 7:
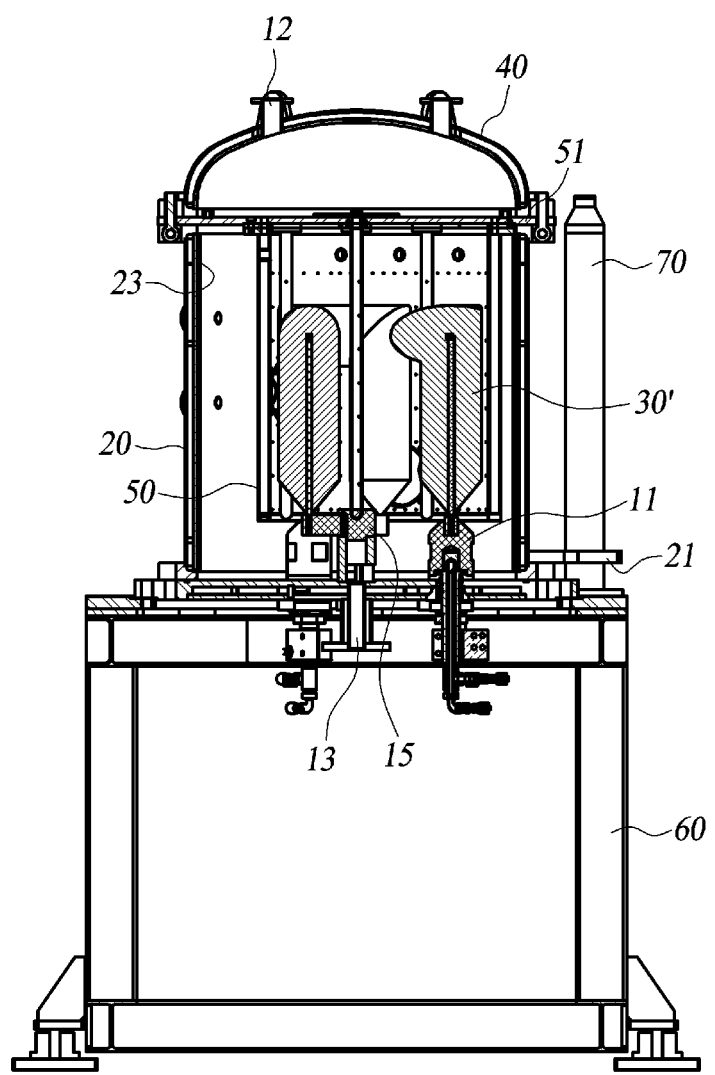
FIG. 7 is an additional cross-sectional view of a polysilicon manufacturing apparatus according to a second embodiment.
Figure 8:
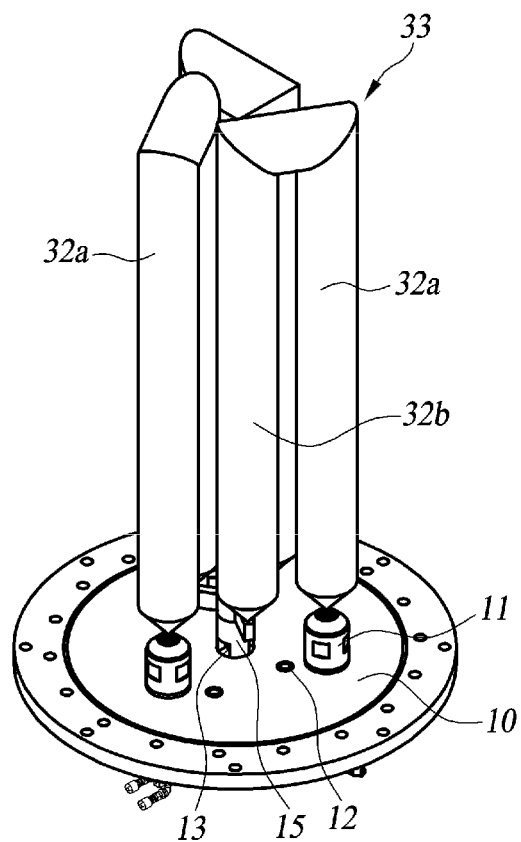
FIG. 8 is a view of the shape of a rod applied to the polysilicon manufacturing apparatus according to the second embodiment.

FIGS. 6 and 7 illustrate a polysilicon manufacturing apparatus according to a second embodiment in cross-sectional views, and FIG. 8 is a view of the shape of a rod applicable to the polysilicon manufacturing apparatus according to the second embodiment.

As illustrated in these drawings, polysilicon manufacturing apparatus 200 according to the second embodiment includes a base plate 10, a container body 20 fixed onto base plate 10, at least one rod 30' which is disposed internally of container body 20 and has legs 32 connected respectively with three electrodes 11 and a neutral point 15 mounted on base plate 10, a reaction gas supply (not shown) communicating and providing with the interior of container body 20 a supply of a reaction gas, and a power supply installation (not shown) connected to electrodes 11 for supplying the electric current which heats rod 30'.

The second embodiment has the same components as those of the first embodiment described above except the addition of neutral point 15 with rod 30' modified for connection thereto. Therefore, in describing polysilicon manufacturing apparatus 200 according to the second embodiment, the shared components by the first embodiment will be denoted by the same reference numerals, avoiding a redundant description of their constructions and functions.

As mentioned above, electrodes 11 for use may be those as disclosed by Korean Patent No. 1116594 entitled "Electrode for high power system" having been assigned to and executed by the present applicant/assignee and incorporated by reference herein. To such electrodes 11, the utility three-phase AC power can be directly connected to improve the power efficiency while reducing the electricity consumption and the resulting operating costs significantly. These electrodes 11 are illustrated in FIGS. 7 and 8 which exhibit an exemplary three electrodes 11 in implementation.

Base plate 10 may have three electrodes 11 installed with neutral point 15 disposed therebetween so that rod 30' provided in polysilicon manufacturing apparatus 200 according to the second embodiment can be connected to three electrodes 11 and neutral point 15 as well. As illustrated in FIG. 8, rod 30' comprises rod divisions 33 respectively formed into inverted U shape or ∩ shape and having divergent legs 32a connected to electrodes 11 respectively and convergent legs 32b commonly connected to neutral point 15 which is mounted on base plate 10 and disposed among electrodes 11. It is preferable to commonly connect the convergent legs 32b to neutral point 15, but is not necessarily limited thereto. Neutral point 15 is provided with a lateral through hole communicating with outlet 13 installed in base plate 10. When viewed from above, rod 30' in this construction generally takes a Y-shape with bent extensions, similar to pinwheel vanes, from which six legs extend to complete the integral rod 30'. Here, it is to be noted that neutral point 15 may serve as the ground when rod 30' is needed to be preheated with a predetermined over-current but otherwise, it can still provide a physical or mechanical support for rod 30'.

As with the first embodiment, polysilicon manufacturing apparatus 200 according to the second embodiment may have container body 20 configured to be separable from lid 40 of a generally hemispherical shape. Optionally, a separate jacket 50 (see FIG. 7) may be mounted inside container body 20 by providing container body 20 and lid 40 with an interposed counter flange 51 which also serves to partition polycrystalline silicon manufacturing apparatus 200 into a supply zone and a reaction zone of the reaction gas. Jacket 50 herein utilizes the technology of Korean Patent Application No. 10-2012-0100211, entitled "Jacket and reactor using same", filed by the present applicant/assignee which is incorporated by reference herein. An exemplary application of such lateral gas supply jacket 50 in a double pipe configuration is schematically illustrated in FIGS. 6 and 7 which are not intended to be limiting the applicability of jacket 50.

In the following, the operation of the polysilicon manufacturing apparatuses 100, 200 according to the present embodiments will be described.

Polysilicon manufacturing apparatus 100 (or 200) supplies electric power to rod 30 (or 30') to provide the same with a surface temperature held at about 1,000° C. or more suitable for generating the reaction. Here, the electric power is supplied by the utility three-phase AC power source through electrodes 11. Such supply of AC power causes an exothermic reaction to first occur at the surface rather than at the center of rod 30 or 30' connected to electrodes 11.

Since most of the superficial electric current is used for heating due to the Skin Effect, a center contact located at top portion 31 of the Y-shaped rod 30 is made to show 0 V (zero volt). On the other hand, when preheating is needed, a predetermined over-current causes imbalance between the current entering rod 30' and its exiting current out of the zero sum and thereby the residual current flows through neutral point 15.

Then, reaction gas ($TCS+H_2$), as supplied from the reaction gas source into container body 20 through inlet 12, is ejected toward or charges around rod 30 or 30'. Different from the prior art involving a pair of electrodes, since polysilicon manufacturing apparatuses 100 and 200 are directly connected to the commercially available three-phase AC power source, some embodiments of the present disclosure uses at least three electrodes 11 and rod 30 or 30' having legs 32 or 32a respectively connected to electrodes 11.

The generated gas (HCl, STC etc.) during the reaction and the unreacted gas (e.g. TCS) may be partially discharged to the outside through outlet pipe 13 provided in base plate 10, or the unreacted gas residual (e.g. $H_2$) may be exhausted through outlet pipe 13 provided on the side wall of container body 20.

Further, in case of using lateral gas supply jacket 50 in the double pipe configuration, after being permitted to enter the passage between the outer tube and the inner tube of jacket 50, the reaction gas advances through a plurality of ejection holes formed in the internal tube until it is ejected toward rod 30 (30') disposed internally of the inner tube.

Supplied internally of jacket 50 maintained at a high temperature in order to cause reaction, the reaction gas having a relatively low temperature (e.g., approximately 150° C.) makes a heat transfer contact with jacket 50 to facilitate attaining the appropriate temperature for the reaction. In addition, directly subjected to the high-temperature heat generated from rod 30 (30'), the reaction gas helps jacket 50 to be relieved from its own temperature increase. Further, this thermal shield provided by jacket 50 reduces the direct thermal transfer to container body 20 and thereby saves thermal energy from being wasted through container body 20. This is in turn translated into less electric power consumption by rod 30 (30'), i.e. electrodes 11 otherwise required to keep heating the internal temperature of container body 20 to a high degree, resulting in a substantially improved efficiency of thermal energy.

Moreover, interior coat 23 of container body 20 immediately emits radiant heat so as to increase the overall energy storage. In addition, coat 23 greatly improves the heat resistance and corrosion resistance of container body 20.

When the reaction is completed, container body 20 accompanied by some assembled components is easily parted and lifted off base plate 10 along guides 70 to facilitate pulling out the final product from polysilicon manufacturing apparatus 100.

It should be understood that even with container body 20 made separable from lid 40, lifting lid 40 may be made to be lifted in unison with components such as jacket 50 having been assembled thereto in order to facilitate the separation and make the ejection of the product easy.

Although exemplary embodiments of the present disclosure have been described for illustrative purposes, those skilled in the art will appreciate that various modifications, additions and substitutions are possible, without departing from the essential characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. An apparatus for manufacturing polysilicon, comprising:
    a base plate;
    a container body coupled to the base plate;
    at least one rod configured to have legs respectively connected with three electrodes installed on the base plate and to be disposed in the container body;
    a reaction gas source configured to communicate with the container body for supplying a reaction gas into the container body; and
    a power supply configured to connect with the electrodes for supplying an electric current to energize the rod to generate heat.

2. The apparatus according to claim 1, wherein the rod is a single body formed to have a top portion trifurcating into a Y-shape, from which three legs extend to connect with the electrodes, respectively.

3. The apparatus according to claim 1, wherein the container body has a circulating fluid inlet and a circulating fluid outlet so that a circulating fluid entering the circulating fluid inlet is led to flow through a space formed between an outer and an inner wall of the container body and subsequently exit the circulating fluid outlet.

4. The apparatus according to claim 3, wherein the circulating fluid serves as a coolant in the container body.

5. The apparatus according to claim 3, wherein the circulating fluid serves as a thermal reserve fluid in the container body and, after exiting the container body, the circulating fluid is heat exchanged with the reactive gas to preheat the reactive gas.

6. The apparatus according to claim 1, wherein the container body is provided at a side wall with a monitor window or camera for observing the inside of the container body.

7. The apparatus according to claim 1, wherein the container body has the interior surface provided with a coating.

8. The apparatus according to claim 7, wherein the coating comprises at least one of silicon, graphite, silicon carbide (SiC) and glass.

9. The apparatus according to claim 1, wherein the container body further comprises a lateral gas supply jacket in a double pipe configuration.

10. The apparatus according to claim 1, wherein
    the base plate is elevated from a floor by using a separate frame, the base plate has at least one mounted guide for assisting to lift the container body off the base plate by restricting the container body into movement in the vertical upward direction, and the container body is laterally provided with at least one ring plate to move along the at least one guide.

11. The apparatus according to claim 1, wherein the electric current is applied from a commercial three-phase AC power supply.

12. An apparatus for manufacturing polysilicon, comprising:
   a base plate;
   a container body coupled to the base plate;
   at least one rod configured to have legs respectively connected with three electrodes and a neutral point installed on the base plate and to be disposed in the container body;
   a reaction gas source configured to communicate with the container body for supplying a reaction gas into the container body; and
   a power supply configured to connect with the electrodes for supplying an electric current to energize the rod to generate heat.

13. The apparatus according to claim 12, wherein the at least one rod is a single body formed to have a plurality of rod divisions in an inverted U-shape, from which legs at one side extend to connect with the electrodes respectively and other legs at another side extend to connect with the neutral point disposed between the electrodes and on the base plate.

14. The apparatus according to claim 12, wherein the container body has a circulating fluid inlet and a circulating fluid outlet so that a circulating fluid entering the circulating fluid inlet is led to flow through a space formed between an outer and an inner wall of the container body and subsequently exit the circulating fluid outlet.

15. The apparatus according to claim 14, wherein the circulating fluid serves as a coolant in the container body.

16. The apparatus according to claim 14, wherein the circulating fluid serves as a thermal reserve fluid in the container body and, after exiting the container body, the circulating fluid is heat exchanged with the reactive gas to preheat the reactive gas.

17. The apparatus according to claim 12, wherein the container body is provided at a side wall with a monitor window or camera for observing the inside of the container body.

18. The apparatus according to claim 12, wherein the container body has the interior surface provided with a coating.

19. The apparatus according to claim 18, wherein the coating comprises at least one of silicon, graphite, silicon carbide (SiC) and glass.

20. The apparatus according to claim 12, wherein the container body further comprises a lateral gas supply jacket in a double pipe configuration.

21. The apparatus according to claim 12, wherein
   the base plate is elevated from a floor by using a separate frame,
   the base plate has at least one mounted guide for assisting to lift the container body off the base plate by restricting the container body into movement in the vertical upward direction, and
   the container body is laterally provided with at least one ring plate to move along the at least one guide.

22. The apparatus according to claim 12, wherein the electric current is applied from a commercial three-phase AC power supply.

* * * * *